United States Patent [19]
Park et al.

[11] Patent Number: 5,970,328
[45] Date of Patent: Oct. 19, 1999

[54] FABRICATION METHOD OF T-SHAPED GATE ELECTRODE IN SEMICONDUCTOR DEVICE

[75] Inventors: Byung-Sun Park; Jin-Hee Lee; Hyung-Sup Yoon; Chul-Sun Park; Kwang-Eui Pyun, all of Daejeon, Rep. of Korea

[73] Assignee: Electronics and Telecommunications Research Institute, Daejeon, Rep. of Korea

[21] Appl. No.: 08/961,407

[22] Filed: Oct. 30, 1997

[30] Foreign Application Priority Data

Dec. 21, 1996 [KR]  Rep. of Korea ...................... 96-69816

[51] Int. Cl.$^6$ ................................................. H01L 21/338
[52] U.S. Cl. ........................................... 438/176; 438/579
[58] Field of Search ..................................... 438/167, 176, 438/182, 574, 577, 579

[56] References Cited

U.S. PATENT DOCUMENTS

| 4,317,125 | 2/1982 | Hughes et al. ........................... 438/176 |
| 4,836,885 | 6/1989 | Breiten et al. ........................... 438/427 |
| 4,839,311 | 6/1989 | Riley et al. ................................. 438/14 |
| 5,304,511 | 4/1994 | Sakai ......................................... 438/577 |
| 5,538,910 | 7/1996 | Oku ........................................... 438/579 |

OTHER PUBLICATIONS

"Submicron T–Shaped Gate HEMT Fabrication Using Deep–UV Lithography", *IEEE Electronic Device Letters*, vol. 15, No. 8, Aug. 1994, pp. 277–279.

High–Performance, 0.1$\mu$m InAlAs/InGaAs High Electron Mobility transistors on GaAs, *IEEE Electron Device Letters*, vol. 15, No. 17, Jul. 1996, pp. 328–330.

"Kink Effect in an InAs–Inserted–Channel InAlAs/InGaAs Inverted HEMT as Low Temperature", *IEEE Electron Device Letters*, vol.15, No. 17, Jul. 1996, pp. 378–380.

"0.1—$\mu$m Gate–Length Pseudomorphic HEMT's", *IEEE Electron Device Letters,* vol. EDL–8, No. 10, Oct. 1987, pp. 489–491.

"0.15 $\mu$m T–shaped Gate Fabrication for GaAs MODFET Using Phase Shift Lithography", *IEEE Electron Device Letters,* vol. 43, No. 2, Feb. 1996, pp. 238–244.

"0.2 Micron Gate Lithography Using Optical Stepper and PSM Technologies", '96 International Conference on GaAs Manufacturing Technology, pp. 148–151.

"Fabrication of 0.1 $\mu$m T–shaped gates by phase–shifting optical lithography", *SPIE vol. 1927 Optical/Laser Microlithography VI*(1993), pp. 42–52.

"Optical Lithography Technique with Dummy Diffraction Mask for 0.20 $\mu$m T–shaped Gate Formation", *SPIE vol. 2440,* pp. 850–857, 1995.

*Primary Examiner*—Chandra Chaudhari
*Attorney, Agent, or Firm*—Cohen, Pontani, Lieberman & Pavane

[57] ABSTRACT

A method for fabricating a T-shaped gate electrode of a high speed semiconductor device such as HEMTs which is applied to high speed logic circuit including low-noise receivers and power amplifiers having a frequency of X-band or more respectively, and MMICs having a frequency of millimeter wave band. Such devices require a short gate length and a large sectional area of the gate pattern. The conventional photolithography techniques are in need of the resolution for fabricating a fine line width. Therefore, electron-beam lithography is most widely used. But, it is difficult to enhance throughput in manufacturing semiconductor devices because a lot of exposure time is required in the methods using electron beams. In the present invention, a silicon oxide film or a silicon nitride film is deposited on a mono-layered resist pattern. A dummy pattern corresponding to a leg of the gate is formed using the silicon oxide film or the silicon nitride film. A leg of the gate electrode is formed at the portion of the dummy pattern. According to the present invention, a step for improving the resolution is not required, and a gate electrode having a very fine line width of a few hundreds Å can be obtained by regulating the thickness of the silicon nitride film.

16 Claims, 8 Drawing Sheets

FABRICATION METHOD OF T-SHAPED GATE ELECTRODE IN SEMICONDUCTOR DEVICE

FIELD OF THE INVENTION

The present invention relates to a fabrication method of semiconductor device, and more particularly, to a fabrication method of a T-shaped gate electrode of a high speed semiconductor device.

BACKGROUND OF THE INVENTION

Generally, high electron mobility transistor (HEMT) is used in integrated circuits having almost all of the frequencies of X-band or more including low-noise receivers and power amplifiers having a frequency of X-band or more respectively, monolithic microwave integrated circuits (MMICs) having a frequency of millimeter wave band, and the like. Preferably, high speed devices such as HEMT transistors should have a short gate length and a large sectional area so as to improve noise characteristics by decreasing the gate resistance. In order to meet the requirements as above, gate electrodes having a T-shaped section is used. But, the conventional photolithography methods are in need of the resolution for fabricating a fine line width below 0.25 $\mu$m of the gate channel. Therefore, electron-beam lithography is most widely used for fabricating the T-shaped gate.

FIGS. 1A to 1G are cross sections illustrating process steps in a method of fabricating a semiconductor device using the electron-beam lithography technique.

First, as illustrated in FIG. 1A, an ohmic layer 1 such as AuGe/Ni/Au and a first metal layer 3 such as Ti/Pt/Au are formed on a GaAs substrate 1. As illustrated in FIG. 1B, a first resist 4 having a very low sensitivity to electron beams, for example PMMA, is coated on the resultant structure and baking process is performed. Then, as shown in FIG. 1C, a second resist 5 having a very high sensitivity to electron beams is coated on the resultant structure and baking process is performed. And, a third resist 6 is coated. Here, the sensitivity to electron beam of the third resist 6 is higher than that of the first resist 4 and lower than that of the second resist 5. Then, baking process is performed. As illustrated in FIG. 1D, exposure to electron beams and development are performed sequentially so as to leave the resists having a suitable shape for T-shaped gate as shown in FIG. 1E. As shown in FIG. 1F, a gate metal layer 7 such as Ti/Pt/Au is deposited. If the resist is stripped, the upper metal layer is lifted off thereby forming a T-shaped gate electrode as shown in FIG. 1G.

In the conventional method employing electron beam irradiation, high resolution (0.10 $\mu$m or less) is obtained, but it is difficult to enhance throughput in manufacturing semiconductor devices because a lot of exposure time is required.

Recently, studies of forming techniques for a T-shaped gate pattern using photolithography techniques are actively underway. And, photolithography techniques for realizing a fine line width is under development by using KrF excimer laser steppers and modified masks such as phase shift masks for improving resolution. But, the above techniques utilize a double layer resist structure or tri-layer resist structure as in the electron beam lithography process, and use a double exposure process and a double lithography process. Therefore, the above techniques have the problems of occurrence of misalignment due to the double lithography process and generation of inter-layer remaining materials derived from the resist hardening process which is an indispensable process to the above techniques. As a result, the characteristics of devices are deteriorated and the process reproducibility can be disturbed.

SUMMARY OF THE INVENTION

It is an object of the present invention to provide a method of fabricating a T-shaped gate electrode having a fine line width by using a photoresist pattern instead of electron beams.

It is another object of the present invention to provide a method of fabricating a T-shaped dual gate having a fine line width by using a photoresist pattern.

In accordance with an embodiment of the present invention, there is provided a method for fabricating a T-shaped gate electrode of a semiconductor device, which comprising the steps of coating a first resist on the semiconductor device on which a predetermined underlayer is formed; forming a resist pattern through which a portion corresponding to a side of the point, at which a leg of the T-shaped gate electrode will be formed, is opened; depositing a first thin film for forming a dummy pattern for the leg on the resultant structure; coating a second resist on the resultant structure; etching back the second resist until the first thin film is exposed; etching the exposed portion of the first thin film to form a dummy pattern by a portion of the etched first thin film; depositing a second thin film composed of the same material as the first thin film on the resultant structure; forming a resist pattern for forming a head of the T-shaped gate electrode, through which the second thin film is exposed, by coating a third resist on the resultant structure, performing an exposure process to light and performing a development process; etching the exposed portion of the second thin film and the dummy pattern of the first thin film; depositing a metal layer for gate electrode; and removing the residual resist pattern and metal layer formed thereon.

In accordance with another embodiment of the present invention, there is provided a method for fabricating a T-shaped dual gate electrode having two legs in a semiconductor device, which comprising the steps of coating a first resist on the semiconductor device on which a predetermined underlayer is formed; forming a resist pattern through which a portion, in which the two legs of the T-shaped gate electrode will be formed, is opened; depositing a first thin film for forming dummy patterns for the two legs on the resultant structure; coating a second resist on the resultant structure; etching back the second resist until the first thin film is exposed; etching the exposed portion of the first thin film to form the dummy patterns by the portions of the etched first thin film; depositing a second thin film composed of the same material as the first thin film on the resultant structure; forming a resist pattern for forming a head of the T-shaped gate electrode, through which the second thin film is exposed, by coating a third resist on the resultant structure, performing an exposure process to light and performing a development process; etching the exposed portion of the second thin film and the dummy patterns of the first thin film; depositing a metal layer for gate electrode; and removing the residual resist pattern and metal layer formed thereon.

BRIEF DESCRIPTION OF THE DRAWINGS

The above and other objects and features of the present invention will become apparent from the following description of preferred embodiments, when taken in conjunction with the accompanying drawings, in which.

DETAILED DESCRIPTION OF THE PREFERRED EMBODIMENTS

An embodiment of the present invention will be described in detail with reference to the accompanying drawings.

Figure 1A:
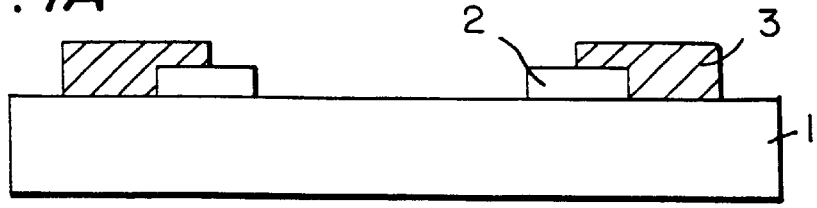
FIGS. 1A to 1G show the sectional views of a developing structure for fabricating a T-shaped gate electrode of the semiconductor device by using electron beams according to the prior art.
Figure 1B:
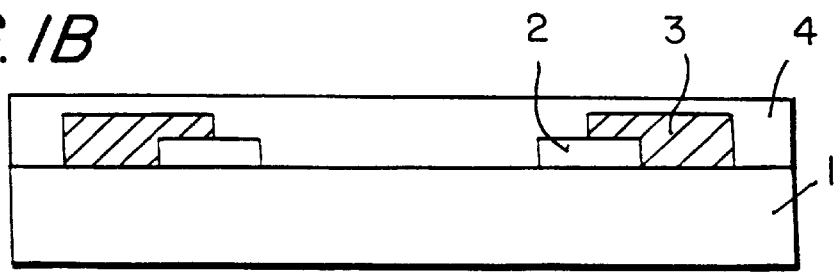
Figure 1C:
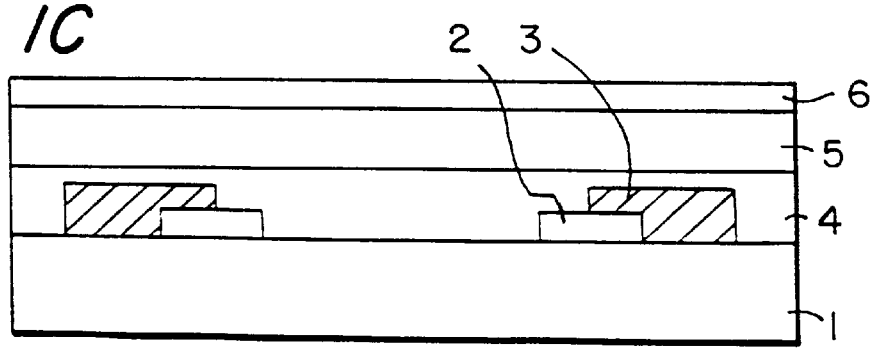
Figure 1D:
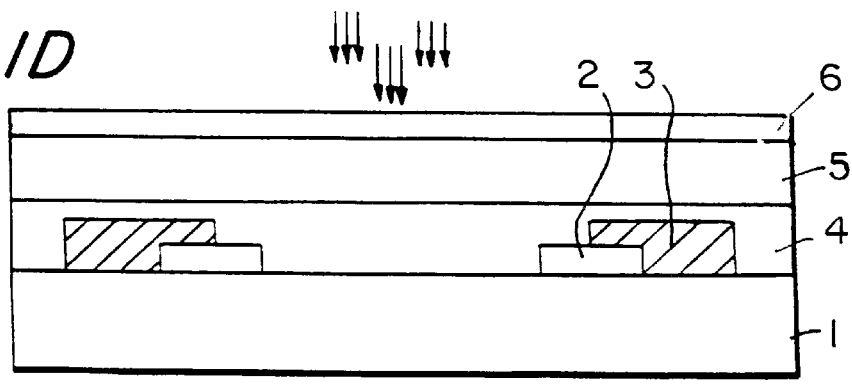
Figure 1E:
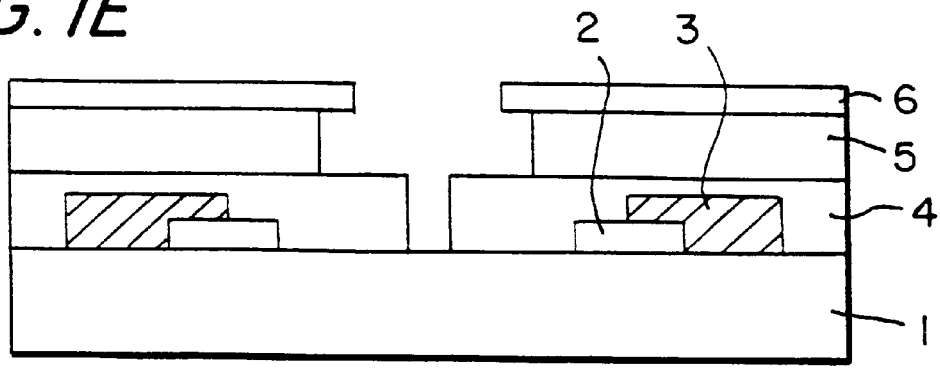
Figure 1F:
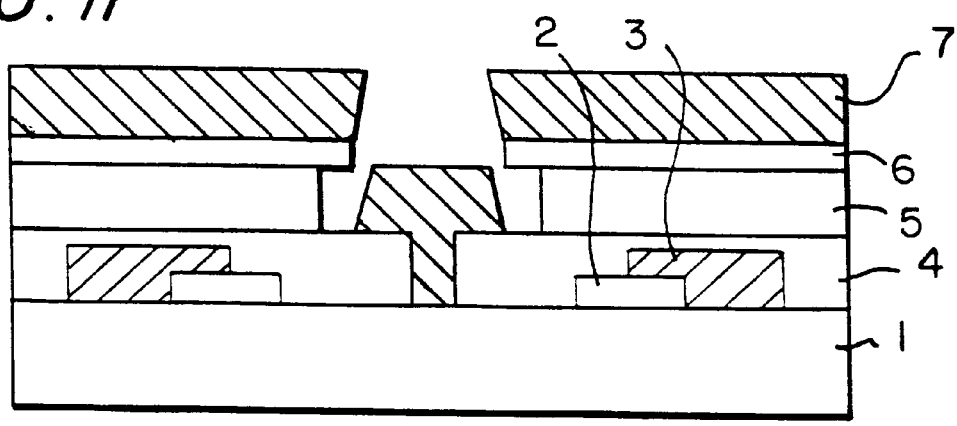
Figure 1G:
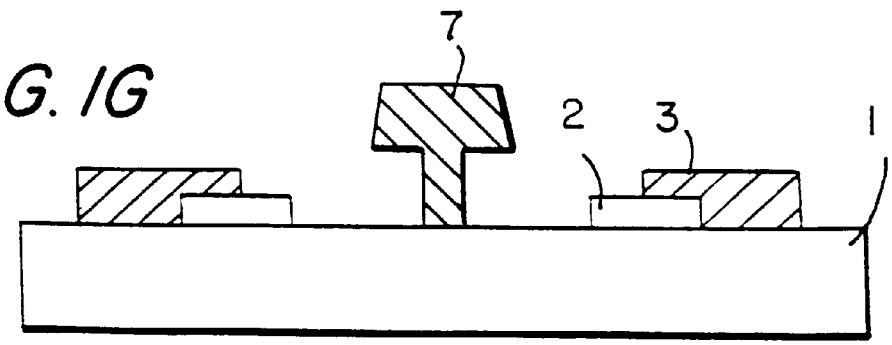
Figure 2A:
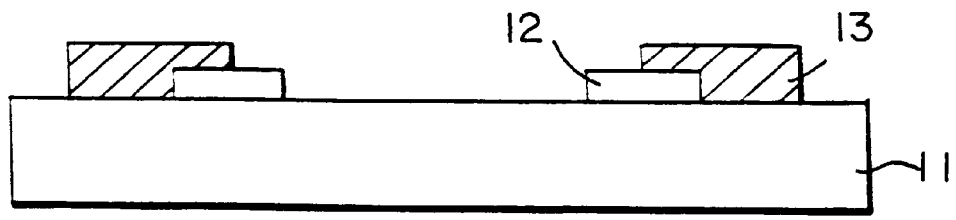
FIGS. 2A to 2M show the sectional views of a developing structure for fabricating a T-shaped gate electrode of the semiconductor device according to an embodiment of the present invention.

Referring to FIG. 2A, an ohmic metal layer 12, for example, AuGe/Ni/Au layer for improving contact resistance and a first metal layer 13, for example Ti/Pt/Au layer for source/drain electrodes are formed on a GaAs substrate 11.

Figure 2B:
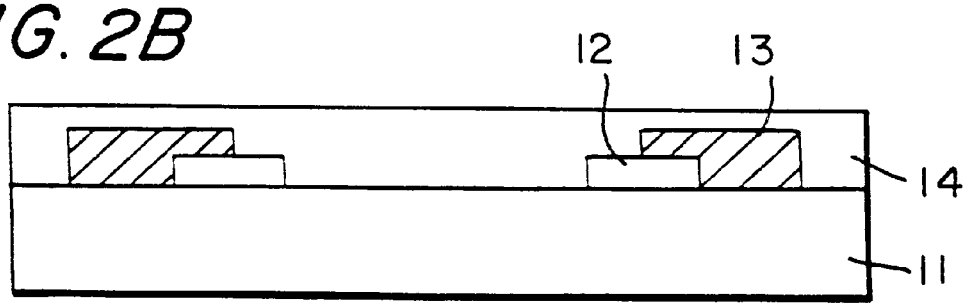
Figure 2C:
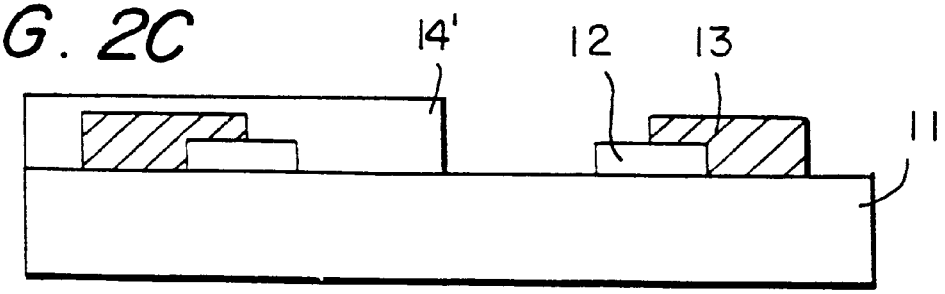

Referring to FIG. 2B, a general photoresist 14' is coated on the resultant structure. Then an exposure process and development process are performed so as to open a portion corresponding to a side of the point, at which a leg of a T-shaped gate electrode will be formed, to form a photoresist pattern 14' as shown in FIG. 2C.

Figure 2D:
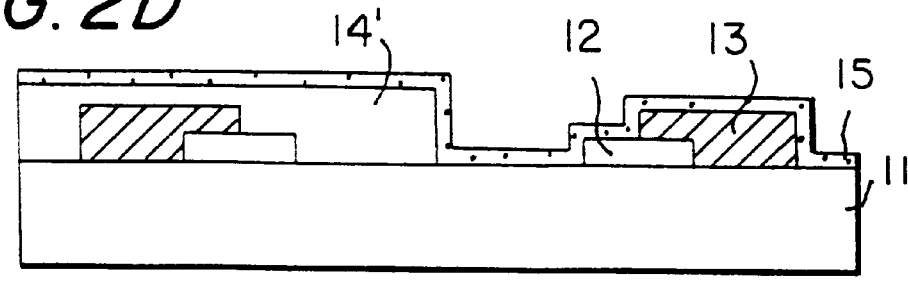

Referring to FIG. 2D, a silicon nitride film 15 is deposited to a predetermined thickness on the resultant structure at the temperature of about 100° C. lest the photoresist pattern 14' should be deformed. The deposition thickness of the silicon nitride film 15 can be easily controlled. And, the thickness of the silicon nitride film 15 will act as a line width of the leg of the gate electrode which will be formed in the following process, and thus act as a dummy pattern. A silicon oxide film may be used instead of the silicon nitride film 15.

Figure 2E:
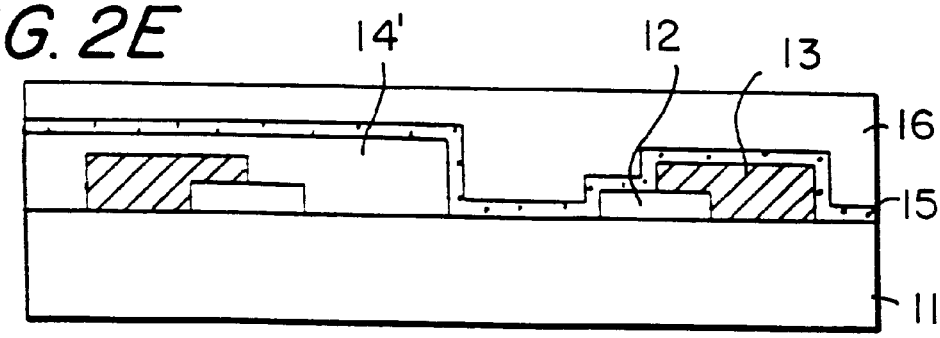

Referring to FIG. 2E, an image reversal resist 16 is coated on the resultant structure and baking process is performed.

Figure 2F:
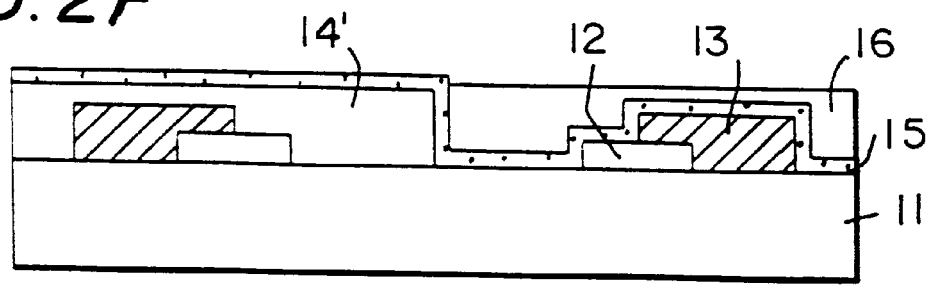

Referring to FIG. 2F, the resultant structure undergoes a blanket exposure to light, is baked for about three minutes at about 100° C., and is developed to expose the silicon nitride film 15.

Figure 2G:
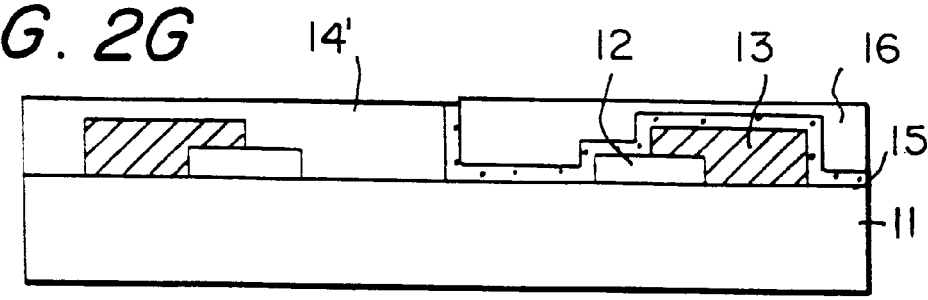
Figure 2H:
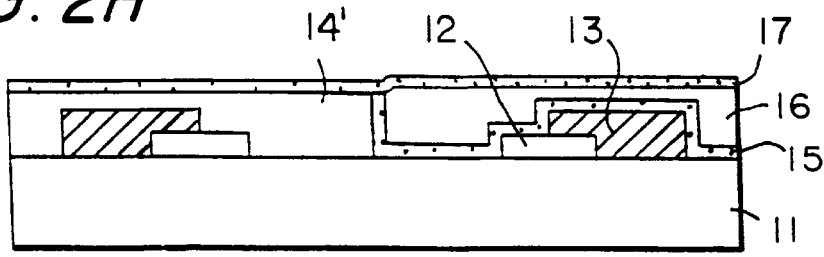

Referring to FIG. 2G, the exposed portion of the silicon nitride film 15 is etched using a BOE HF solution having the ratio of about 30:1 to form a dummy pattern by a portion of the etched silicon nitride film 15.

Referring to 2H, a silicon nitride film 17 is deposited to a predetermined thickness on the resultant structure at the temperature of about 100° C. using a PECVD technique lest the photoresist pattern 14' should be deformed. The silicon nitride film 17 acts as a blocking layer for preventing the solvent from being penetrated into under layers in the following process for coating photoresist.

Figure 2I:
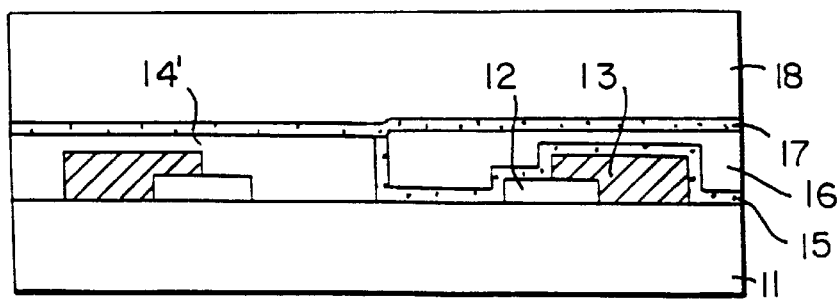
Figure 2J:
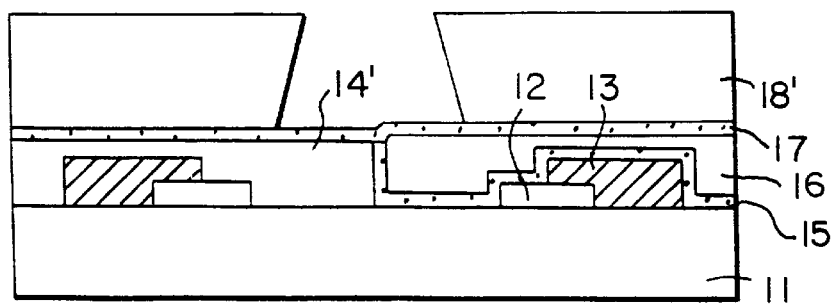

Referring to FIG. 2I, an image reversal resist 18 is coated, exposed to light, and developed to form a photoresist pattern 18' for forming a head of the T-shaped gate electrode through which the silicon nitride film 17 is exposed as shown in FIG. 2J.

Figure 2K:
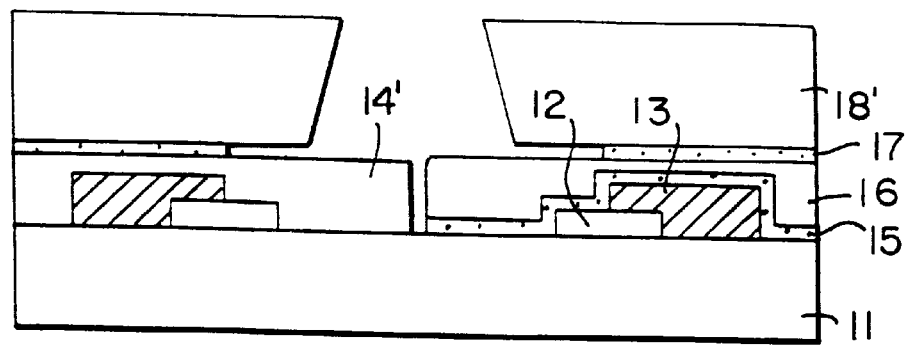

Referring to FIG. 2K, the exposed portion of the silicon nitride film 17 is etched using the BOE HF solution having the ratio of 30:1. Here, the etching rate and etching time should be suitably regulated such that a portion of the silicon nitride film 15 used as the dummy pattern for the leg of the gate electrode is etched simultaneously.

Figure 2L:
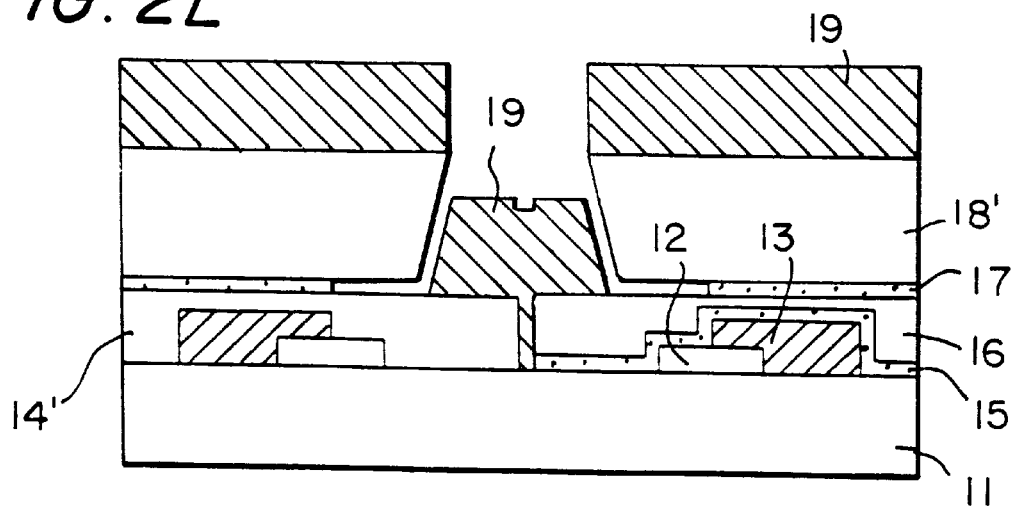
Figure 2M:
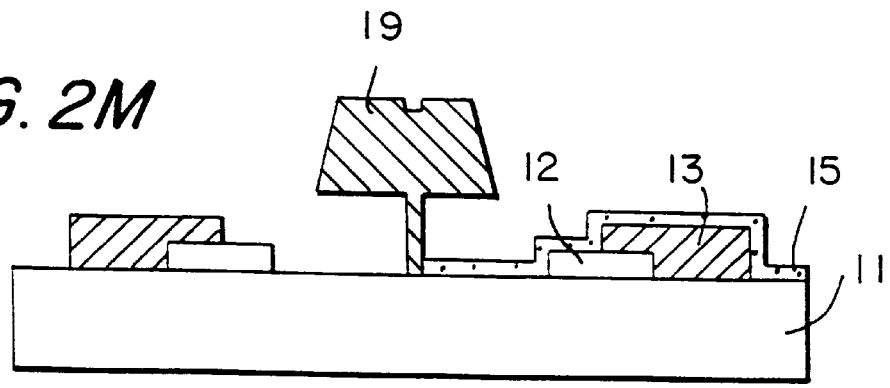

Referring to FIG. 2L, a gate electrode metal layer 19, for example Ti/Pt/Au layer, is deposited and a resist strip process is performed using acetone solution to effect the lift-off of the metal layer on the resist, thereby forming a T-shaped gate electrode, as shown in FIG. 2M.

FIGS. 3A to 3E show the sectional views of a developing structure for fabricating a T-shaped dual gate electrode of the semiconductor device according to another embodiment of the present invention.

Fundamentally, the present embodiment is the same as the first embodiment described in connection with FIGS. 2A to 2M excepting the shape of a photoresist pattern 24' for forming a dummy pattern of the gate electrode which comprises two legs.

Figure 3A:
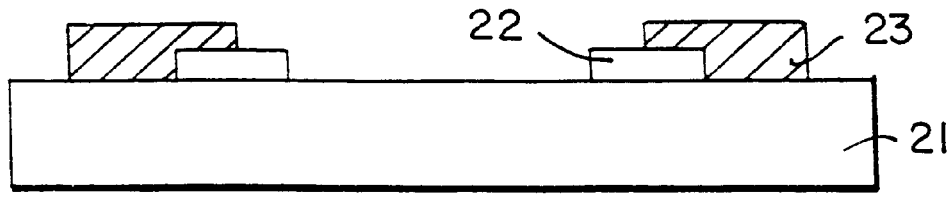
FIGS. 3A to 3E show the sectional views of a developing structure for fabricating a T-shaped dual gate electrode of the semiconductor device according to another embodiment of the present invention.

More specifically, an ohmic metal layer 22, for example AuGe/Ni/Au layer for improving contact resistance, and a first metal layer 23, for example Ti/Pt/Au layer, for source/drain electrodes are formed on a GaAs substrate 21, as shown in FIG. 3A.

Figure 3B:
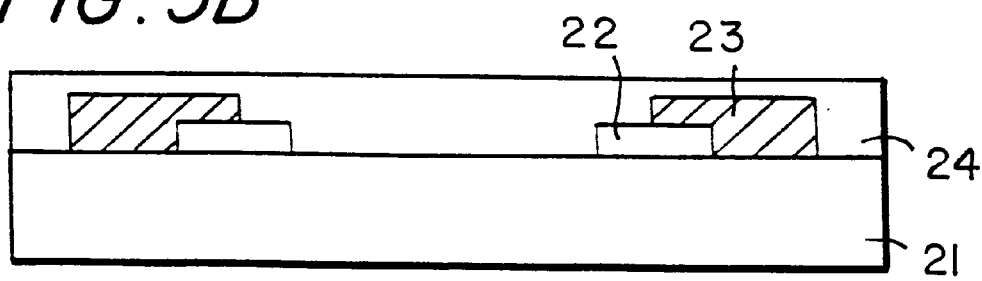
Figure 3C:
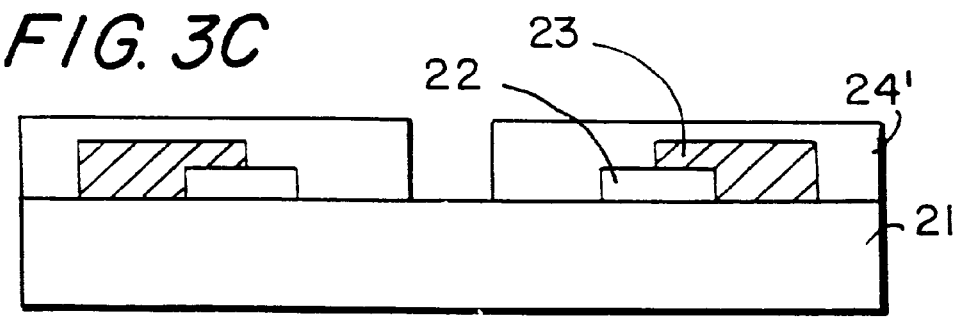

Referring to FIG. 3B, a general photoresist 24 is coated on the resultant structure. Then, a portion of the GaAs substrate 21 in which two legs will be formed in the following process, in other words, a portion between the two points, at which two legs will be formed in the following process respectively, is opened through an exposure process to light and development process to form a photoresist pattern 24' as shown in FIG. 3C.

Figure 3D:
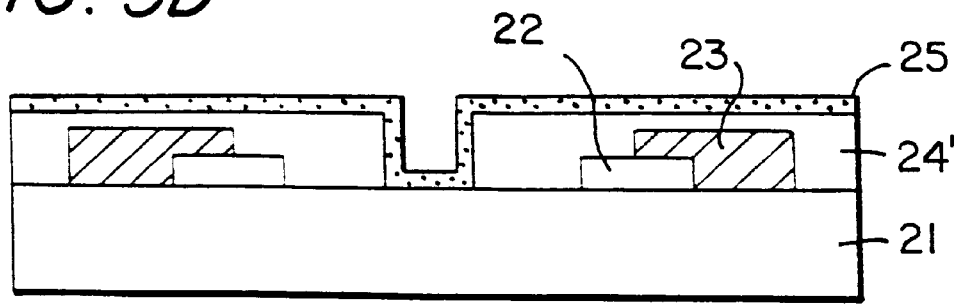

Referring to FIG. 3D, a silicon nitride film 25 is deposited to a predetermined thickness on the resultant structure at the temperature of about 100° C. using a PECVD technique lest the photoresist pattern 24' should be deformed. The thickness of the silicon nitride film 25 will act as a line width of each leg of the gate electrode which will be formed in the following process, and thus act as a dummy pattern. A silicon oxide film may be used instead of the silicon nitride film 25.

Figure 3E:
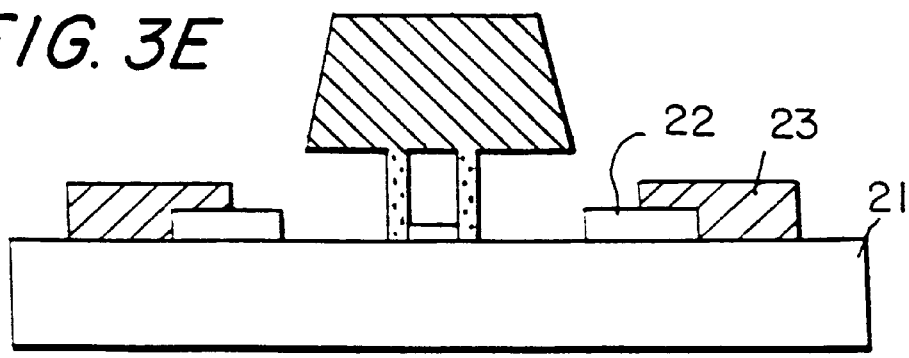

Then, the processes as described with reference to FIGS. 2E to 2L are repeated to form a T-shaped dual gate electrode as shown in FIG. 3E.

According to the present invention, a fine line width of about a few hundred Å can be formed because the gate line width can be easily regulated by the deposition thickness of the thin film. And, the line width having uniformity of the line width with a margin within 5% can be obtained since the uniformity of the line width over the whole surface of the wafer is regulated by the deposition thickness of the thin film. Further, stability of the process is improved by preventing the T-shaped gate from falling down by using the inter-layer dielectric film as a support. Finally, there is little variation of the line width of the gate in accordance with the variation of the time for treating the residues on the substrate, and the residues on the substrate can be perfectly treated. As a result, there is an effect of improvements of the process reproducibility and the characteristics of the devices.

While the present invention has been described with respect to certain preferred embodiments only, other modifications and variations may be made without departing from the scope of the present invention as set forth in the following claims.

What is claimed is:

1. A method for fabricating a T-shaped electrode of a semiconductor device, comprising the steps of:
   a. forming a first resist layer on a substrate of the semiconductor device;
   b. forming a resist pattern by opening a portion of the first resist layer corresponding to a side of the point at which a leg of the T-shaped gate electrode will be formed;

c. depositing a first thin film for forming a dummy pattern for the leg on the resultant structure after step b.;

d. forming a second resist layer on the resultant structure after step c.;

e. removing the second resist layer by etching until a top layer of the first thin film is exposed;

f. etching the exposed portion of the first thin film to form the dummy pattern for the leg;

g. depositing a second thin film composed of the same material as the first thin film on the resultant structure after step f.;

h. forming a resist pattern for forming a head of the T-shaped electrode, through which a portion of the second thin film is exposed, by forming a third resist layer on the resultant structure after step g., exposing a portion of the third resist layer to light, and performing a development process to expose the portion of the second thin film;

i. etching the exposed portion of the second thin film and the portion of the first thin film which forms the dummy pattern for the leg;

j. depositing a metal layer for gate electrode on the resultant structure after step i.; and k. removing the residual first, second and third resist layers and the residual metal layer formed thereon.

2. The method of claim 1, wherein step e comprises the steps of:

performing a blanket exposure of the second resist layer to light; and developing the second resist layer until the top portion of the first thin film is exposed.

3. The method of claim 1, wherein steps d and h include forming an image reversal resist layer.

4. The method of claim 2, further comprising the step of baking the resultant structure after the step of performing a blanket exposure.

5. The method of claim 4, wherein the step of baking comprises baking the resultant structure for 3 minutes at the temperature of 100° C.

6. The method of claim 1, wherein steps c. and g. comprise forming a thin film of a silicon nitride.

7. The method of claim 1, wherein steps c. and g. comprise the step of depositing the thin film at the temperature of 100° C. respectively.

8. The method of claim 6, wherein steps f and i further comprise using a BOE HF solution having the ratio of 30:1 for etching the first and second thin films, respectively.

9. A method for fabricating a T-shaped electrode having two legs in a semiconductor device, comprising the steps of:

a. forming a first resist layer on a substrate of the semiconductor device;

b. forming a resist pattern by opening a portion of the first resist layer, in which the two legs of the T-shaped electrode will be formed;

c. depositing a first thin film for forming dummy patterns for the two legs on the resultant structure;

d. forming a second resist layer on the resultant structure after step c.;

e. removing the second resist layer by etching until a top portion of the first thin film is exposed;

f. etching the exposed portion of the first thin film to form the dummy patterns for the two legs;

g. depositing a second thin film composed of the same material as the first thin film on the resultant structure after step f.;

h. forming a resist pattern for forming a head of the T-shaped electrode, through which a portion of the second thin film is exposed, by forming a third resist layer to light on the resultant structure after step g., exposing a portion of the third resist layer to light, and performing a development process to expose the portion of the second thin film;

i. etching the exposed portion of the second thin film and the portions of the first thin film which forms dummy patterns for the two legs;

j. depositing a metal layer for gate electrode on the resultant structure after step i.; and k. removing the residual first, second, and third resist layer and the residual metal layer formed thereon.

10. The method of claim 9, wherein step e comprises the step of:

performing a blanket exposure of the second resist layer to light; and developing the second resist layer until the top portion of the first thin film is exposed.

11. The method of claim 9, wherein steps d and h include forming an image reversal resist layer.

12. The method of claim 10, further comprising the step of baking after the step of performing a blanket exposure the second resist to layer to light.

13. The method of claim 12, wherein the step of baking comprises baking the resultant structure for 3 minutes at the temperature of 100° C.

14. The method of claim 9, wherein steps c and g comprise forming a thin film of comprising a silicon nitride.

15. The method of claim 9, wherein steps c and g comprise the step of depositing the thin film the temperature of 100° C. respectively.

16. The method of claim 14, wherein steps f and i further comprise using a BOE HF solution having the ratio of 30:1 for etching the first and second thin films, respectively.

* * * * *